Sept. 22, 1964

R. J. ANDRES 3,150,298

STUD-MOUNTED RECTIFIER

Original Filed April 16, 1958

INVENTOR.
Raymond J. Andres,
BY Mueller & Aichele
Atty's.

United States Patent Office 3,150,298
Patented Sept. 22, 1964

3,150,298

STUD-MOUNTED RECTIFIER

Raymond J. Andres, Newport Beach, Calif., assignor to Motorola, Inc., Chicago, Ill., a corporation of Illinois Continuation of application Ser. No. 728,969, Apr. 16, 1958. This application Aug. 8, 1960, Ser. No. 48,324
1 Claim. (Cl. 317—234)

This invention relates to rectifiers and more particularly to semiconductor rectifier devices adapted for connection to a heat sink. The present application is a continuation of co-pending application Serial No. 728,969, filed April 16, 1958.

Because of the heat generated during the operation of a semiconductor rectifier or diode, it is desirable to provide such devices in a package that can easily be attached to a suitable heat sink for minimizing temperature changes at the rectifying junction. One convenient method of attachment is through a threaded stud member extending from a cover enclosing the rectifier body itself. The stud is screwed into a threaded opening in a chassis member or a relatively large area metallic plate of effective heat dissipating characteristics. Rectifiers or diodes of this type include a semiconductor body within which the rectifying junction is formed and a pair of terminals connected to opposite sides of the junction. In such prior art devices, one of these terminals is a lead wire and the other is the threaded stud member with the lead and the stud member extending from opposite ends of the rectifier package. This structure has a number of practical disadvantages. One disadvantage is the lack of flexibility of the design in providing for only a limited number of ways of mounting the unit. Thus, a rectifier must be mounted with the stud connected to the ground provided by the heat sink or chassis or a solder lug must be employed to make connection to the side of the rectifier from which the stud extends. Connections through solder lugs are less desirable than direct solder connections since solder lugs are known to have a greater tendency to become loosened due to mechanical vibration, and also because there is a contact resistance between the rectifier unit and the solder lug depending upon surface conditions. A direct solder connection, on the other hand, provides a constantly low resistance contact.

Another disadvantage of a conventional stud-mounted rectifier is that it is impossible to test the unit prior to completion of its assembly by the attachment of a cover member. This is because, in the configuration normally employed, one side of the semiconductor rectifier body rests on an internal pedestal forming a part of the cover member while the other side is connected to a lead extending from the other end of the rectifier package. In such an arrangement, the cover member must be attached at the same time electrical connection is made to the rectifier body and the unit cannot be checked electrically until its assembly is essentially complete. In other types of conventional units, a lead is attached to a die previously mounted on a stud member and while it is possible to test the unit electrically before a cover member is attached, detachment of the die from the stud and subsequent use thereof with another type of mounting is not possible. Therefore, in conventional devices, if a rectifier body is found not to have the electrical properties desired, the entire unit must be discarded. This results in wasting of otherwise usable rectifier bodies and adds to manufacturing costs.

It is an object of this invention to provide a rectifier unit having a stud to facilitate its connection to a heat sink while at the same time being capable of direct solder connection to a circuit at both rectifier terminals.

It is another object of the invention to provide a rectifier package whose configuration is such that it can be thermally connected to a heat sink and electrically connected into an electronic circuit in a number of different ways thus increasing circuit design flexibility.

It is a further object of the invention to provide a rectifier that can be tested prior to the completion of its assembly so that the partially completed units can be graded in accordance with their electrical characteristics and subsequently attached to covers most appropriate for the use for which they are best suited thus minimizing the number of units which must be discarded.

It is still a further object of the invention to provide a rectifier package carrying a threaded stud for connecting it to a heat sink and at the same time capable of receiving direct solder connections into a circuit at both of its terminals with both terminals at a different electrical potential than the heat sink.

A feature of the invention is a rectifier package having a pair of lead wires extending from one end thereof and a threaded stud member extending from the other end so that both terminals of the rectifier may be connected into a circuit by direct solder connections.

Another feature of the invention is the provision of a rectifier subassembly capable of being tested electrically prior to the attachment of a stud carrying cover member. The units can thus be graded electrically and sorted prior to completion of their assembly.

Still another feature of the invention is the provision of a stud-carrying cover member having an open end opposite the stud which member fits over and encloses a rectifier subassembly.

Figures 1, 2, 2A, 3, 4, 5, 6:
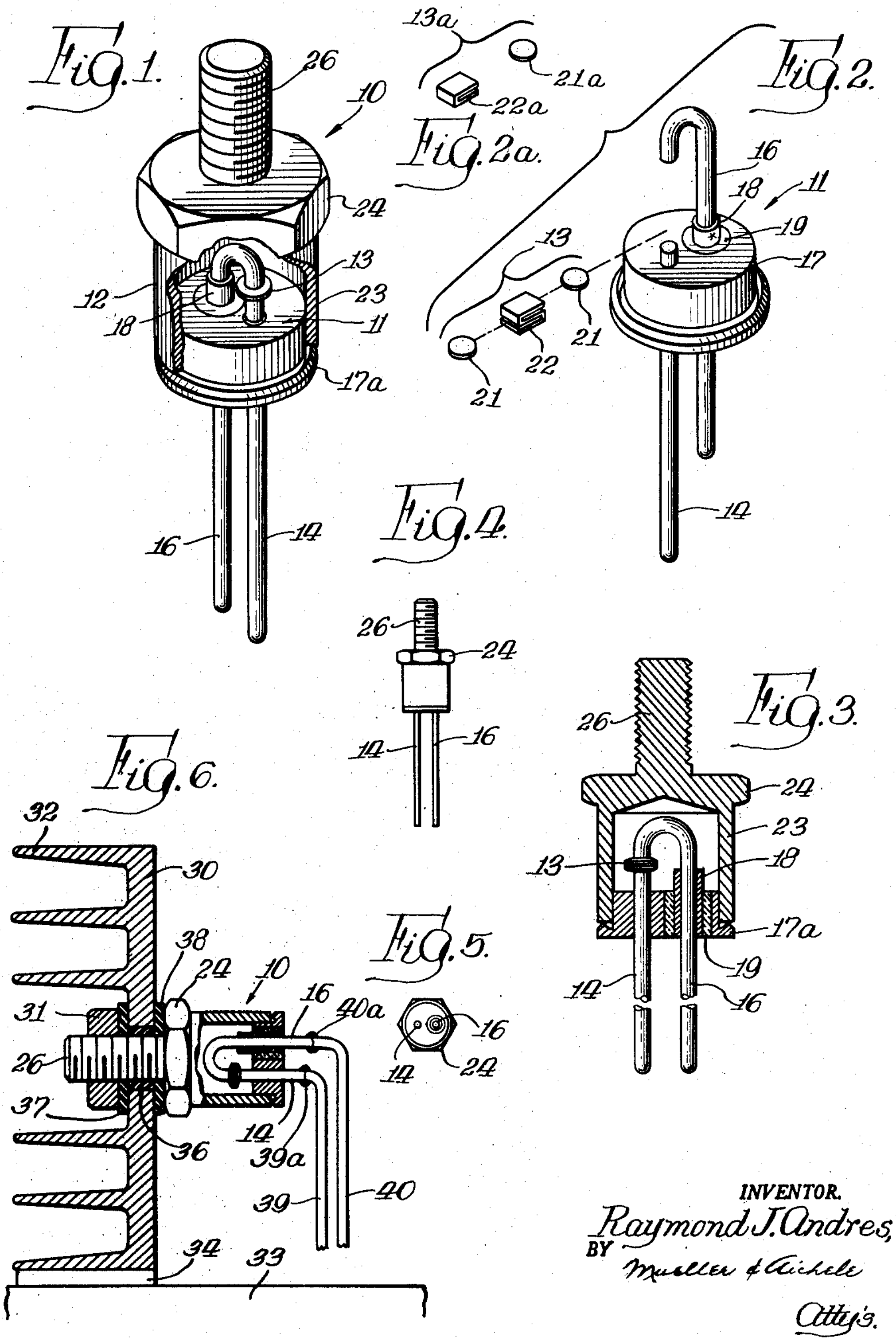
FIG. 1 is a greatly enlarged perspective view of a rectifier package embodying the invention with a portion of its cover member broken away to illustrate positioning of the rectifier body.
FIG. 2 is an exploded and enlarged perspective view of a rectifier subassembly in which the rectifying body is made up of a pair of semiconductor dice.

FIG. 2*a* is an enlarged perspective view of a single semiconductor die which makes up the rectifier body in one particular embodiment of the invention together with a solder ribbon used to secure the die to lead wires;

FIG. 3 is a greatly enlarged view in vertical section taken through a rectifier package of the type illustrated in FIG. 1;

FIG. 4 is a view in side elevation of a typical unit embodying the invention showing the actual size of the unit;

FIG. 5 is a bottom plan view of the unit illustrated in FIG. 4; and

FIG. 6 is a view partly in section showing the attachment of a rectifier package to a heat sink.

The present invention is embodied in a rectifier unit which includes a subassembly made up of a semiconductor rectifier body having a pair of opposite sides with a straight lead wire connected to one side, a J-shaped or hooked lead wire connected to the other side, and a flat header plate through which both lead wires extend in the same direction. The subassembly can be tested to determine the electrical properties of the rectifier body and the units sorted to channel them to the application to which they are best suited. This subassembly is an embodiment of an invention of R. J. Andres and C. G. Thornton as described and claimed in Patent No. 2,986,678, assigned to the present assignee. The device of this application uses the Andres-Thornton invention, and further has a cover member carrying a threaded stud at one end which is welded to a shoulder of the header plate of a suitable mount and encloses the rectifying body. The assembled package thus has a stud member extending from one end and a pair of lead wires extending from the opposite end so that both terminals of the rectifier can be connected into an electronic circuit by direct solder connections to the lead wires with the unit secured by the stud member to a heat sink insulated or spaced from the circuit chassis. Since one of the lead wires is in electrical contact with the header plate and through the cover member, to the stud, the unit may also be mounted by grounding one side of the rectifier to a chassis member through the stud, or a solder lug connection to one side of the rectifier can be made through the cover, as with conventional stud mounted rectifiers. Thus, the rectifier package of this invention offers the circuit designer all of the mounting alternatives available for prior art stud mounted rectifiers plus an additional alternative mounting. This alternative mounting permits use of desirable direct solder connections to both rectifier terminals while at the same time providing means for attachment of the rectifier package to a suitable heat sink.

The accompanying drawings illustrate a rectifier unit 10 which includes a subassembly 11 and a cover member 12. Subassembly 11 is made up of semiconductor die unit 13 secured to the ends of straight lead wire 14 and hooked or J-shaped lead wire 16. The lead wires are supported in a flat, disc-shaped header plate 17 made of a conductive metal such as copper or steel. Straight lead 14 is held within an aperture of header plate 17 by a solder connection and is electrically and thermally connected thereto. J-shaped lead 16, on the other hand, is insulated from the header plate by means of an alloy sleeve 18 (conveniently made of the alloy "Kovar") and a glass bushing 19 as particularly illustrated in FIG. 3.

In the embodiment of the invention illustrated in FIG. 2, the semiconductor die unit 13 includes a pair of semiconductor dice 21 each having a pair of opposed faces with the dice soldered in face-to-face relation and held to the lead wires 14 and 16 by solder connections supplied by the solder ribbon 22. In assembling the semiconductor die unit 13, the dice 21 are inserted inside the arms of the solder ribbon 22 so as to form a unit having alternate layers of the dice and solder. During the assembly process the solder is melted thus securing the dice to one another and to the lead wires.

Each of the dice 21 is made of a semiconductor such as germanium or silicon (preferably the latter), and has been treated to form a PN rectifying junction therein. One face of the die is on the P side of the junction and the other on the N side. In the embodiments in which the dice 21 are of silicon, it is desirable that their surfaces be coated with a metal such as nickel to facilitate the making of ohmic connections to the faces of each die and establish electrical connection to the rectifying junction.

FIG. 2*a* illustrates the semiconductor die unit **13*a* made up of a single semiconductor rectifying die 21*a* which during the course of assembly is held between the arms of solder ribbon 22*a***. It will be understood, of course, that the semiconductor die units may be built up using any number of dice with a greater number being used for diodes of higher breakdown voltage. Increased breakdown voltages are obtained by stacking the dice with the P side of one die resting on the N side of the adjacent die.

The method of making the subassembly 11 forms no part of the present invention and is described in the copending application of Raymond J. Andres and Charles G. Thornton, Serial No. 666,902, filed June 20, 1957, now Patent 2,986,678, and assigned to the assignee of this application.

Since the subassembly 11 is an electrically complete unit, its breakdown voltage and other significant properties can be tested prior to the attachment of a cover. This cannot be done in the case of conventional stud mounted rectifiers where one side of the rectifier body is connected directly to the cover which supports the stud. The advantage of testing prior to cover attachment is that the subassemblies whose breakdown voltages and other electrical characteristics suit them for industrial applications may then be secured to stud carrying members while the other subassemblies may be attached to different types of covers appropriate for applications in which lower breakdown voltages are required and for which the units are suited. Since, in the present state of the art, it is not always possible to accurately predetermine the minimum breakdown voltage of all of the units made in a particular production run, this invention makes it possible to salvage those units which do not pass the most rigorous tests so that the wasting of otherwise substandard units is minimized.

Subassemblies having electrical characteristics suiting them for use as industrial rectifiers handling high power level currents and requiring attachment to a heat sink are attached to cover members such as 12 which include a cylindrical body portion 23, a hexagonal shoulder portion 24 and a threaded stud 26 extending from the closed end thereof. As shown in FIGS. 1 and 3, the cover 12 is attached at its open end to the shoulder **17*a* of header plate 17. Cover member 12 is made of a metal such as mild steel which can be secured to the shoulder 17*a*** by capacitor discharge welding.

The mounting of the stud carrying cover member 12 independently of lead wires 16 and 14 not only permits testing of the subassemblies 11 prior to attachment of the cover but also increases the mounting versatility of the rectifier package. FIG. 6 illustrates an advantageous type of mounting which is unavailable to conventional stud mounted rectifiers. The rectifier 10 package is secured to the heat sink 30 by screwing the threaded stud 26 into an opening thereon and holding it with a nut 31. The heat sink 30 includes fins 32 to increase its heat transfer area and is made of a good thermal conductor such as aluminum. The heat sink 30 is carried on an electronic chassis member indicated generally at 33 and is spaced and insulated therefrom by the spacer 34. The shoulder 24 of the cover is hexagonally shaped to facilitate the manual attachment of the unit to the heat sink.

The stud 26 is insulated from the heat sink 30 by the threaded bushing 36 which is of a suitable insulating material such as mica or a synthetic organic material such as "Mylar." Insulating washer 37 is provided between the nut 31 and heat sink 30 and the insulating washer 38 spaces the shoulder 24 of the rectifier from the heat sink. The insulating material used in the washers is effective to electrically insulate the rectifier from the heat sink but does not interfere materially with the transfer of heat thereto from the rectifier.

The lead wires 14 and 16 constituting terminals of the rectifier are now both available for connection by soldering them directly to leads 39 and 40 as indicated by connections **39*a* and 40*a*. Leads 39 and 40 are connected to appropriate circuit elements (not shown) on the chassis 33**. Thus, both terminals may be connected into a circuit at potentials different from the ground potential. This type of connection is not available with a conventional stud mounted rectifier unless a solder lug is provided on the cover member to make connection to one side of the rectifier. Solder lug connections are generally unsatisfactory because of their tendency to loosen due to vibration and because of high contact resistance. Because conventional stud-mounted rectifiers often require solder lug connections to their cover, the choice of cover materials is necessarily restricted to those to which solder connections are best made.

If desired, the rectifier package 10 can easily be mounted in any of the conventional ways available to conventional stud mounted rectifiers. Thus, it can be substituted for conventional units in circuits designed for such units as by grounding one side of the rectifier as to a chassis by means of the stud, cutting off lead 14 and using lead 16 to make connections of the other side to the circuit. Alternatively, lead 14 may be cut off and connection made to that side of the rectifier through a solder lug as in conventional units. The rectifier of the present invention thus has the added advantage of being adapted to replace conventional stud mounted rectifiers in circuit applications designed for such units while at the same time being capable of being mounted in a different way as previously described.

The invention thus provides a stud mounted rectifier of novel configuration which is capable of being tested before completion of its assembly and therefore permits sorting and grading of the units for selective attachment of different types of covers. Because the cover of the rectifier is mounted independently of either of the terminal leads of the rectifier, the unit may be attached to a heat sink through the stud and the rectifier terminals incorporated into circuit by direct solder connections.

I claim:

A semiconductor diode device adapted to be mounted by a stud on such device and having two lead portions constituting electrical terminals for the device, said device including in combination, a metallic housing structure having an open end, a closed end, and a hollow interior, a threaded metallic stud connected to said closed end of said housing structure and projecting from the outside thereof, said closed end of said housing structure having a polygonal-shaped portion forming with said stud an integral bolt-like structure capable of making a secure heat conducting mounting connection for said device, metallic base means closing the open end of said housing structure, said base means having a rim portion sealed to the open end of said housing structure and having a raised portion located centrally of said rim portion and projecting into the interior of said housing structure, semiconductor diode means positioned within said housing structure and having first and second connection portions constituting the only electrical contacts for said semiconductor means, said first connection portion being electrically common with said base means, first and second lead means supported by said base means and available on the outside of said device for making electrical connections, said first lead means being electrically common with said base means, and said second lead means being insulated from said base means and having a portion connected to said second connection portion of said semiconductor means, said semiconductor means being in heat exchange relation with said base means, and said base means, said housing structure and said stud providing a heat conductive path for removing heat from said semiconductor means during operation of said device.

References Cited in the file of this patent

UNITED STATES PATENTS

| | | |
|---|---|---|
| 2,730,663 | Harty | Jan. 10, 1956 |
| 2,751,528 | Burton | June 19, 1956 |
| 2,861,226 | Lootens | Nov. 18, 1958 |
| 2,887,628 | Zierdt | May 19, 1959 |
| 2,929,972 | Roka et al. | Mar. 22, 1960 |
| 2,962,394 | Andres | Nov. 29, 1960 |
| 2,986,678 | Andres et al. | May 30, 1961 |